(12) United States Patent
Bauco

(10) Patent No.: US 10,222,629 B2
(45) Date of Patent: Mar. 5, 2019

(54) LASER LIGHT ILLUMINATION SYSTEMS WITH SPECKLE REDUCTION AND SPECKLE REDUCTION METHODS

(71) Applicant: Corning Incorporated, Corning, NY (US)

(72) Inventor: Anthony Sebastian Bauco, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 263 days.

(21) Appl. No.: 15/002,764

(22) Filed: Jan. 21, 2016

(65) Prior Publication Data

US 2016/0231585 A1 Aug. 11, 2016

Related U.S. Application Data

(60) Provisional application No. 62/112,995, filed on Feb. 6, 2015.

(51) Int. Cl.
*G02B 27/48* (2006.01)
*F21V 8/00* (2006.01)
(Continued)

(52) U.S. Cl.
CPC .......... *G02B 27/48* (2013.01); *G02B 5/0242* (2013.01); *G02B 6/001* (2013.01); *G02B 6/0006* (2013.01);
(Continued)

(58) Field of Classification Search
CPC .. G02B 27/48; G02B 5/0242; G02B 6/03633; G02B 6/02047; G02B 6/03616; G02B 6/0006; G02B 6/001; H01S 5/0427
See application file for complete search history.

(56) References Cited

U.S. PATENT DOCUMENTS 6,470,122 B1 10/2002 Doumuki
8,068,267 B2 11/2011 Grasser
(Continued)

FOREIGN PATENT DOCUMENTS

DE 102008009138 A1 8/2009
JP 2010042153 A 2/2010
WO 2015008211 A1 2/2015

OTHER PUBLICATIONS

Dingel et al. "Laser-diode microscope with fiber illumination", Optics Communications, vol. 93 No. 1-2 (1992) pp. 27-32 XP024455507.
(Continued)

*Primary Examiner* — Y M. Lee

(57) ABSTRACT

A light illumination system that includes a light-diffusing optical fiber capable of multimode operation in a wavelength range from 300 to 3000 nm; and a laser light source comprising a control element and a laser diode having a cavity. The laser light source is configured to produce a laser light output in response to an injection current input. In addition, the laser light source is arranged in proximity to the light-diffusing optical fiber such that the laser light output is coupled into the optical fiber. Further, the control element is arranged to reduce speckle in the laser light output by modulating the injection current input at a modulation frequency of 30 Hz or greater.

19 Claims, 3 Drawing Sheets

(51) Int. Cl.
  *G02B 5/02*    (2006.01)
  *G02B 6/036*   (2006.01)
  *H01S 5/042*   (2006.01)

(52) U.S. Cl.
  CPC ........ *G02B 6/03633* (2013.01); *H01S 5/0427* (2013.01)

(56) References Cited

U.S. PATENT DOCUMENTS

| | | |
|---|---|---|
| 8,197,068 B2 | 6/2012 | Bauco |
| 8,644,651 B2 | 2/2014 | Dougherty |
| 2011/0319712 A1 | 12/2011 | Kuroda et al. |
| 2012/0127437 A1* | 5/2012 | Kuksenkov ............ G03B 21/40 353/31 |
| 2013/0136406 A1* | 5/2013 | Bookbinder ........... G02B 6/028 385/124 |
| 2013/0156391 A1 | 6/2013 | Logunov et al. |
| 2013/0272014 A1 | 10/2013 | Logunov et al. |
| 2014/0355295 A1* | 12/2014 | Kuchinisky ............ G02B 6/001 362/558 |
| 2015/0346411 A1* | 12/2015 | Bauco ................... F21V 31/005 362/553 |
| 2016/0146998 A1* | 5/2016 | Tissot .................. G02B 6/0041 362/583 |

OTHER PUBLICATIONS

International Search Report and Written Opinion PCT/US2016/016483 dated Aug. 10, 2016.

\* cited by examiner

LASER LIGHT ILLUMINATION SYSTEMS WITH SPECKLE REDUCTION AND SPECKLE REDUCTION METHODS

This application claims the benefit of priority under 35 U.S.C. § 119 of U.S. Provisional Application Ser. No. 62/112,995 filed on Feb. 6, 2015 the content of which is relied upon and incorporated herein by reference in its entirety.

BACKGROUND

The present disclosure generally relates to speckle reduction concepts for light illumination systems that require lasers for use as the light source for light diffusing optics such as a light diffusing fiber (LDF).

LDFs require a certain level of spatial coherence from their illumination source to achieve high coupling efficiency at a low cost. The spatial coherence requirement implies that laser sources are required for each color (red, green and blue). Typically, the laser sources are more coherent than the level of coherency required by an LDF. An LDF requires some level of spatial coherence, but does not require a spatially single mode beam because it is typically configured for multimode operation. In order to make the laser source inexpensive, this extra spatial tolerance can be utilized as alignment tolerance and the laser source fills several of the modes of the LDF. After a short length of propagation down the LDF fiber, light is scattered from the modes excited by the laser source into all of the higher order modes supported by the LDF. The number of modes supported can exceed 100, depending on the fiber core diameter and the numerical aperture (NA) of the LDF.

The problem with having a moderate amount of both spatial and temporal coherence is that the LDF itself contains a noticeable amount of speckle. In addition, the areas illuminated with the emitted light from the LDF may also contain have speckle. Speckle, resulting from the optical interference of the beam with itself, can be perceived as undesirable noise associated with the operation of the light illumination system. Further, the amount of speckle associated with a given light illumination system can have various levels of severity. In addition, the sensitivity of consumers and other individuals using a particular light illumination system to speckle also can vary. Certain individuals, for example, can find even small levels of speckle associated with a given light illumination system (e.g., those that rely on laser light sources in conjunction with LDFs) undesirable compared to other light production systems.

Consequently, there is a need for light illumination systems that minimize or eliminate speckle effects with cost effective schemes, particularly systems employing laser light sources and LDFs.

SUMMARY

According to one embodiment, a light illumination system is provided that includes a light-diffusing optical fiber capable of multimode operation in a wavelength range from 300 to 3000 nm; and a laser light source comprising a control element and a laser diode having a cavity. The laser light source is configured to produce a laser light output in response to an injection current input. In addition, the laser light source is arranged in proximity to the light-diffusing optical fiber such that the laser light output is coupled into the optical fiber. Further, the control element is arranged to reduce speckle in the laser light output by modulating the injection current input at a modulation frequency of 30 Hz or greater.

According to another aspect, the light illumination system is provided with a light-diffusing optical that includes: (a) a core region that comprises a core glass composition; (b) an inner cladding that surrounds the core region and comprises a cladding glass composition that substantially differs from the core glass composition; and (c) an outer cladding that surrounds the inner cladding and is doped with scattering particles. In certain aspects, the core region of the light-diffusing optical fiber has a low-melting point glass composition comprising an up-dopant.

In some aspects of these systems, the control element is configured to reduce speckle in the laser light output by modulating the injection current input at a modulation frequency of 60 Hz or greater. The modulation frequency in certain aspects can set at 120 Hz or greater. In certain aspects, the control element can modulate the injection current with any of various waveforms including but not limited to square, triangular, sawtooth and sinusoidal waveforms.

According to a further embodiment, a method of reducing speckle from a laser-illuminated light diffusing optical fiber is provided. The method includes the step: directing laser light output from a laser light source that includes a laser diode into a light-diffusing optical fiber capable of multimode operation between a wavelength of 300 and 3000 nm. The laser light output is based at least in part on an injection current in the laser diode. The method also includes the steps: producing a diffuse light pattern that emanates from the cladding of the light-diffusing optical fiber based on the laser light output directed into the fiber; controlling the magnitude and a temporal aspect of the injection current with a control element; and modulating the injection current with the control element at a modulation frequency of 30 Hz or greater to minimize speckle in the diffuse light pattern emanating from the fiber.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments.

DETAILED DESCRIPTION

Figure 1:
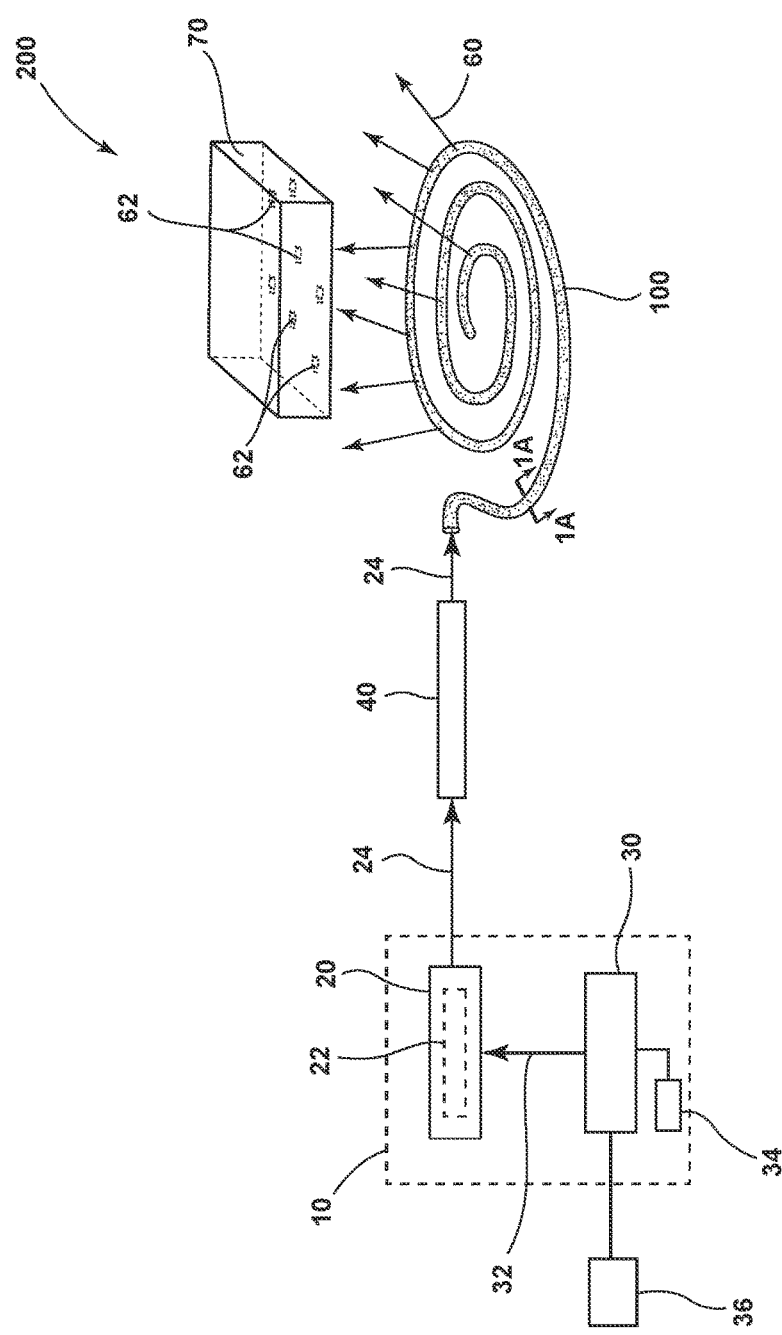
FIG. 1 is a schematic of a light illumination system according to an aspect of the disclosure.

Reference will now be made in detail to the present preferred embodiments, examples of which are illustrated in the accompanying drawings. Whenever possible, the same reference numerals will be used throughout the drawings to refer to the same or like parts. It should be understood that the embodiments disclosed herein are merely examples, each incorporating certain benefits of the present invention.

Various modifications and alterations may be made to the following examples within the scope of the present invention, and aspects of the different examples may be mixed in different ways to achieve yet further examples. Accordingly, the true scope of the invention is to be understood from the entirety of the present disclosure, in view of but not limited to the embodiments described herein.

Terms such as "horizontal," "vertical," "front," "back," etc., and the use of Cartesian Coordinates are for the sake of reference in the drawings and for ease of description and are not intended to be strictly limiting either in the description or in the claims as to an absolute orientation and/or direction.

In the description of the invention below, the following terms and phrases are used in connection to light-diffusing fibers.

The "refractive index profile" is the relationship between the refractive index or the relative refractive index and the waveguide (fiber) radius.

The "relative refractive index percent" is defined as:

$$\Delta(r) \% = 100 \times [n(r)^2 - (n_{REF})^2]/2n(r)^2,$$

where n(r) is the refractive index at radius, r, unless otherwise specified. The relative refractive index percent $\Delta(r)$ % is defined at 850 nm unless otherwise specified. In one aspect, the reference index $n_{REF}$ is silica glass with the refractive index of 1.452498 at 850 nm. In another aspect, $n_{REF}$ is the maximum refractive index of the cladding glass at 850 nm. As used herein, the relative refractive index is represented by $\Delta$ and its values are given in units of "%", unless otherwise specified. In cases where the refractive index of a region is less than the reference index $n_{REF}$, the relative index percent is negative and is referred to as having a depressed region or depressed-index, and the minimum relative refractive index is calculated at the point at which the relative index is most negative unless otherwise specified. In cases where the refractive index of a region is greater than the reference index $n_{REF}$, the relative index percent is positive and the region can be said to be raised or to have a positive index.

An "up-dopant" is herein considered to be a dopant which has a propensity to raise the refractive index of a region of a light-diffusing optical fiber relative to pure undoped $SiO_2$. A "down-dopant" is herein considered to be a dopant which has a propensity to lower the refractive index of a region of the fiber relative to pure undoped $SiO_2$. An up-dopant may be present in a region of a light-diffusing optical fiber having a negative relative refractive index when accompanied by one or more other dopants which are not up-dopants. Likewise, one or more other dopants which are not up-dopants may be present in a region of a light-diffusing optical fiber having a positive relative refractive index. A down-dopant may be present in a region of a light-diffusing optical fiber having a positive relative refractive index when accompanied by one or more other dopants which are not down-dopants.

Likewise, one or more other dopants which are not down-dopants may be present in a region of a light-diffusing optical fiber having a negative relative refractive-index.

The "numerical aperture" ("NA") of a light-diffusing optical fiber is defined as:

$$NA = \sqrt{n_{core}^2 - n_{clad}^2},$$

where NA is the numerical aperture of the fiber, $n_{core}$ is the refractive index of the core region of the fiber and $n_{clad}$ is the refractive index of the cladding region of the fiber.

The "number of modes" supported by an LDF is defined as:

$$M = 2\left(\frac{\pi}{\lambda} r \times NA\right)^2$$

where NA is the numerical aperture of the fiber, r is the radius of the core (or core region) of the fiber, $\lambda$ is the wavelength of the laser light traveling inside of the LDF and M is the total number of bounded modes in the LDF.

The disclosure is intended to provide techniques, and light illumination systems, that can rapidly vary the speckle field produced by an LDF coupled to an illumination source, such as a laser, to wash out the speckle pattern detected or otherwise observed by a human observer. Any interference between two optical beams is dependent on the relative optical phase of the beams. The speckle field and pattern will vary with a change in the relative phase of the optical fields. As such, scrambling the optical phase profile (both longitudinally down the fiber as well as radially within the core of the fiber) of the light emitted from the LDF should result in a reduction of the perceived speckle patterns.

This disclosure presents techniques and systems that use this wavelength dither, combined with the chromatic dispersion of the modes of an LDF, to convert this wavelength dither into a speckle pattern dither. The same mechanism presented which varies the speckle pattern also has the additional benefit of reducing the temporal coherence of the light launched into the LDF. This reduces the visibility or contrast of the speckle observed. Together, the observed speckle pattern is effectively eliminated by these techniques and systems.

The techniques and light illumination systems in this disclosure wash out the speckle patterns generated by a laser illuminated LDF. When the light emitted from the fiber is viewed directly or when light emitted from the fiber is scattered off another object, a speckle field is produced due to self-interference of the light scattered by, and emitted from, the LDF. Since this speckle field is dependent on the optical phase profile of the source which is illuminating the object, or being observed directly, the speckle pattern observed by the human eye will vary depending on the optical phase profile of the emitted light. If the optical phase profile is varied at a rate greater than the response time of the eye (typically greater than 30 Hz), the speckle patterns observed by the human eye will be perceived as being washed out.

An advantage of these techniques and light illumination systems is that they do not require mechanical motion of any passive optical components, or any additional active optical elements. As such, no further electrical power will be required in these illumination systems to achieve the speckle reduction, thus providing a significant benefit without a loss in energy efficiency. In addition, no additional optical components capable of mechanical motion will be required to achieve the speckle reduction, thus minimizing additional costs associated with the aspects of this disclosure compared to conventional illumination systems.

Another advantage offered by these speckle reduction techniques and light illumination systems with such capabilities is high reliability. As no mechanical motion of the fiber and/or laser is required according to the aspects of this disclosure, the long-term reliability of the illumination systems are not expected to be compromised by the increased functionality offered by the speckle reduction capabilities.

The light illumination systems according to the disclosure can employ a laser-illuminated LDF that employs an injection current modulation to achieve speckle reduction through wavelength dither. In some aspects, the laser includes a Fabry-Perot laser diode. The laser diode is directly coupled into an LDF or into a transmission fiber which is later mated into the LDF. The LDF employed in the light illumination system is a fiber configured for multimode operation. In preferred aspects, the LDF is a highly multimoded fiber capable of supporting well over 1000 modes in a range of wavelengths from 300 to 3000 nm.

The light illumination systems configured for speckle reduction and associated techniques rely on the chromatic dispersion of the many modes of the multimode LDF to generate varying phase profiles. Each mode has a group velocity that is dependent on the wavelength of the laser light. The differences in group velocity between the modes are also dependent on the wavelength of the laser light. Consequently, the optical phase profile, including its longitudinal and radial components, will change as wavelength is varied. This phenomenon is indicative of chromatic dispersion. The resulting speckle field pattern which depends on the relative phases between the modes of the fiber, as well as the phase as a function of axial position along the fiber, will also vary with wavelength.

According to aspects of the disclosure, the wavelength dither leading to the speckle reduction is achieved by modulating the injection current of the laser diode within the light illumination system. When the injection current of the laser diode is modulated, the phase of the internal longitudinal modes within the laser cavity varies due to a combination of thermally-induced refractive index changes of the laser itself, along with refractive index changes directly related to the varying injection current.

Accordingly, both temperature and injection current changes vary the gain of the laser cavity within the light illumination systems in the disclosure. These effects change the gain of the laser by varying the imaginary component of the index of refraction. Through the Kramers-Kronig relation, as understood by those in the operative field, the change in the imaginary component of the index of refraction also means that the real part of the index of refraction will also vary based on these changes to the gain of the laser cavity. As the phase of the laser cavity is varied based on the modulating to the injection current, the wavelengths of the longitudinal (Fabry-Perot) modes of the laser cavity will be dithered. Consequently, the modulating of the injection current into the laser directly results in laser wavelength dither.

According to the foregoing principles, these light illumination systems can then modulate the injection current at a frequency that is greater than the response time of the human eye; consequently, the resulting speckle pattern will be substantially washed out with regard to the perception of a human observer. In preferred aspects of the disclosure, the injection current is modulated at a frequency that is several times greater than the response time of the human eye. In addition to the phase dither that is generated by the modulated injection current, the temporal coherence of the laser diode source is also reduced due to this dither. The gain profile of the laser will then dither with the injection current modulations, and the resulting laser output will have a larger effective optical bandwidth. These effects will also reduce the visibility and perception of any speckle associated with the output from the LDF.

Referring to FIG. 1, a light illumination system 200 configured for speckle reduction is depicted according to an aspect of the disclosure. The system 200 includes a light-diffusing optical fiber 100 configured for multimode operation in a wavelength range from 300 to 3000 nm. Typically, the fiber 100 will have a numerical aperture (NA) that is greater than or equal to 0.4. In certain aspects, the core region of the fiber has a radius that ranges from about 50 μm to about 600 μm. For example, LDFs with a numerical aperture of 0.4 and such core region radial dimensions are capable of supporting from 50,000 to 7,000,000 modes, respectively, at a wavelength of 400 nm. Even higher numbers of modes can be supported in LDFs having numerical apertures greater than 0.4.

As also shown in FIG. 1, the light-diffusing optical fiber 100 employed in the light illumination system 200 can produce a diffuse light pattern 60 when light rays, such as from laser light output 24, are directed into one end of the fiber. In certain aspects of the system 200, the fiber 100 is configured to emanate diffuse light pattern 60 substantially along its length. In other aspects, the fiber 100 is configured to selectively emanate the diffuse light pattern 60 from one or more sections of the fiber along its length. In certain configurations of the system 200, the diffuse light pattern 60 is produced by the fiber 100 with a degree of attenuation from about 0.5 to 5 dB/m. As further depicted by FIG. 1, the diffuse light pattern 60 can be used by system 100 to illuminate one or more objects 70.

The light illumination system 200 depicted in FIG. 1 also includes a laser light source 10. The laser light source 10 includes a laser diode 20 and a control element 30. In some aspects, the control element 30 is coupled to a current generator 34 and a processor 36. As such, the current generator 34 provides injection current to the control element 30, which is then injected into the laser diode 20 as an injection current input 32. The processor 36 can be employed to effect control via the control element 30 over the injection current input 32. As also depicted in FIG. 1, the diode 20 includes a cavity 22. The diode 20 receives the injection current input 32 and produces laser light output 24.

Referring again to FIG. 1, the laser light output 24 of the laser diode 20 is coupled to the light-diffusing fiber 100 within the light illumination system 200. In some embodiments of the system 200, the laser light output 24 is directed into a transmission fiber 40, which is then coupled into the light-diffusing optical fiber 100. In those aspects of system 200 employing a transmission fiber 40, the fiber 40 can be generally matched to the light-diffusing fiber 100 in terms of composition and dimensions of the structures in these fibers (e.g., composition and dimensions of the core region); however, the transmission fiber 40 typically will lack scattering features (e.g., see scattering agents 132 in FIG. 1A and their corresponding description). In certain aspects, the transmission fiber 40 and light-diffusing optical fiber 100 are configured to exhibit about the same NA value based on a selection of cladding composition and cladding dimensions. In other aspects of the light illumination system 200, the laser light output 24 is coupled directly into the light-diffusing optical fiber 100 without any intervening transmission fibers.

Within the light illumination system 200, the control element 30 is configured to control the laser light output 24 based on a modulation of the injection current input 32 at a modulation frequency greater than 30 Hz. In certain aspects, the processor 36 can direct the control element 30 to modulate the injection current input 32 according to a waveform including but not limited to waveforms principally characterized by square waves, triangular waves, sawtooth waves and sinusoidal waves. As such, the magnitude of the injection current input 32 is varied by the control element 30 to produce a wavelength dither within the laser light output 24.

Referring again to FIG. 1, the dithering of the laser light output 24 by the light illumination system 200 via injection current modulation serves to reduce, minimize or otherwise eliminate speckle 62 associated with a diffuse light pattern 60 that emanates from the light-diffusing optical fiber 100. As a result, the amount of speckle 62 observed on an object 70 illuminated by the diffuse light pattern 60 is reduced, minimized or otherwise eliminated by the light illumination system 200. As noted earlier, a modulation of the injection current input 32 at a modulation frequency of 30 Hz can significantly reduce the amount of speckle 62 on the object 70 for most laser light sources. In certain aspects, modulation frequencies of 60 Hz, 90 Hz, 120 Hz or higher can further reduce the amount of speckle 62 observed on the object 70.

An upper limit for the modulation frequency employed by the light illumination system 200 that effectively reduces speckle 62 is on the order of a few kHz, depending on the operating wavelength of the laser 10 and its thermal characteristics. At very high modulation frequencies exceeding a few kHz, the thermal response rate of the laser 10 can effectively reduce wavelength dithering because the changes in the injection current input 32 are too frequent to allow for temperature fluctuations that lead to refractive index changes within the laser 10. Conversely, modulation frequencies higher than the response time of the human eye of greater than 30 Hz, but lower than a few kHz, can effectively modulate the injection current 32 such that temperature changes within the laser 10 can be manifested in refractive index changes. Consequently, these modulation frequencies can then produce wavelength dither sufficient to achieve a significant reduction in the speckle 62 in the illuminated object 70.

Figure 2:
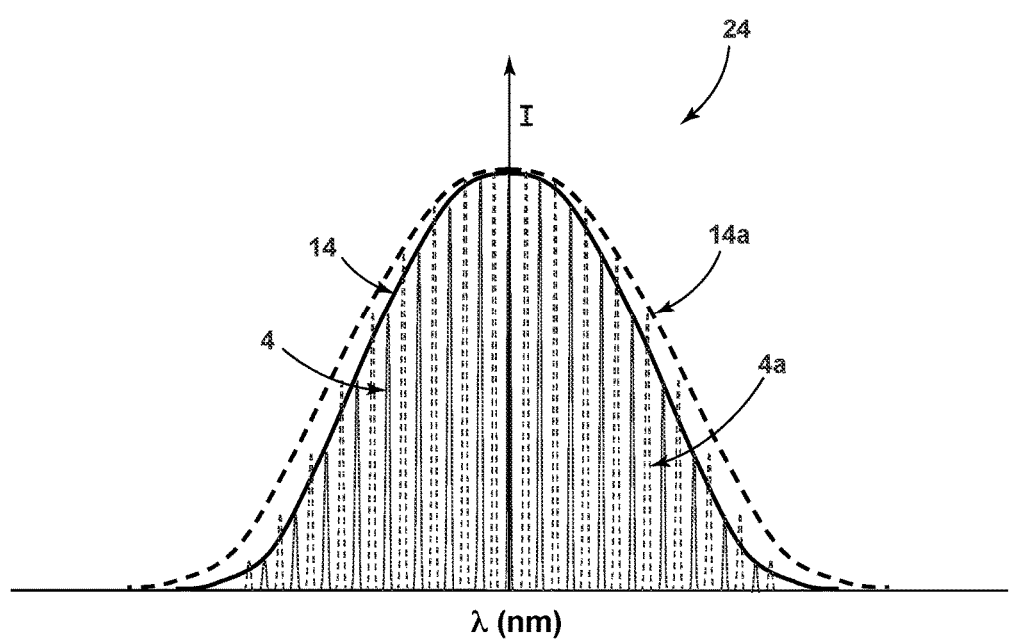
FIG. 2 is a schematic plot of intensity vs. wavelength for the laser depicted in the light illumination system of FIG. 1.

As shown in exemplary fashion in FIG. 2, a laser light output 24 from a light illumination system 200 may contain cavity modes 4, dithered cavity modes 4a, a gain profile 14 and a broadened gain profile 14a associated with the laser light source 10 and diode 20 (not shown). The collection of cavity modes 4 shown in FIG. 2 are the longitudinal modes of the laser associated at a particular injection current and optical phase according to the physical and electrical characteristics of the laser. The gain profile 14 reflects the collection of cavity modes 4 over the wavelength range of the laser. The portion of the gain profile 14 above the loss threshold for the laser (not shown) would be manifested in lasing of light, emanating at the cavity modes 4. It should be understood that a different set of cavity modes 4 would appear for the same laser operating at a different injection current. As such, a particular laser, such as laser 10 that produces laser light output 24, will produce various shapes of gain profile 14, depending on the magnitude of the injection current.

Referring again to FIG. 2, the dithered cavity modes 4a reflect a slight wavelength variance in the cavity modes 4 associated with a modulation of the injection current (e.g., a modulating of the injection current 32 by the control element 30 at a frequency of 30 Hz or greater), caused by thermally-induced refractive index changes as well as changes in the refractive index of the laser from the changes to the magnitude of the injection current over a short time period. The broadened gain profile 14a generally reflects the collection of the dithered cavity modes 4a over the wavelength range of the laser. Consequently, the modulating of the injection current to the laser results in a broadened gain profile 14a with a larger effective optical bandwidth which directly reduces the visibility of any speckle associated with the laser light output 24 and the diffuse light pattern 60 that emanates from the light-diffusing optical fiber 100 within the light illumination system 200.

Figure 1A:
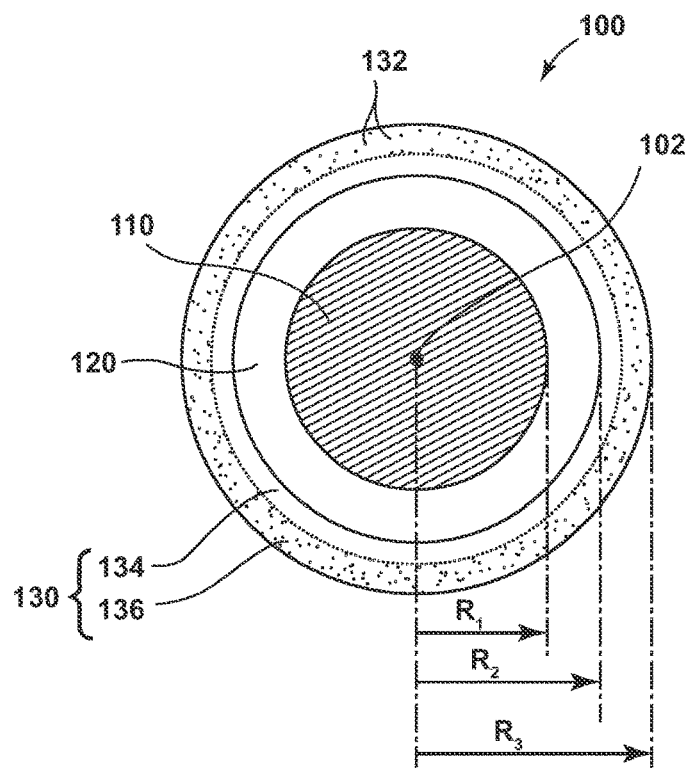
FIG. 1A is a cross-sectional view of the light-diffusing optical fiber depicted in the light illumination system of FIG. 1 as viewed along the direction 1A-1A.
Figure 1B:
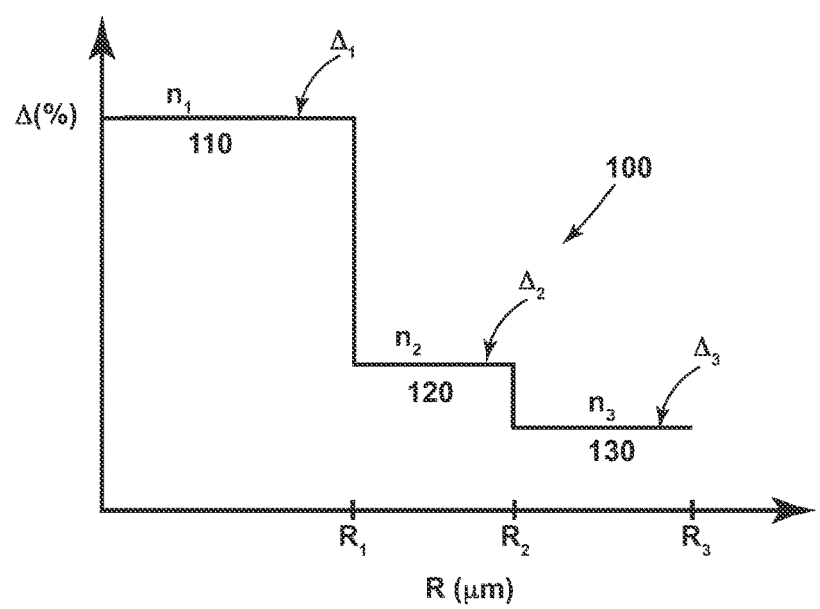
FIG. 1B is a schematic illustration of a plot of relative refractive index versus fiber radius for the light-diffusing optical fiber depicted in the light illumination system of FIG. 1.

Referring to FIGS. 1A and 1B, one embodiment of a light-diffusing optical fiber 100 is depicted that may be employed in a light illumination system 200. The light-diffusing optical fiber 100 generally comprises a core region 110 with a refractive index, $n_1$, and relative refractive index $\Delta_1$. The core region 110 comprises a glass composition classified as a doped or un-doped silica glass primarily comprising $SiO_2$. The core region 110 may have a radius, $R_1$, from 10 μm to about 600 μm, centered about an axis 102. Preferably, $R_1$ is from 50 μm to about 600 μm. In other embodiments, $R_1$ is about 50 μm, 60 μm, 70 μm, 80 μm, 90 μm, 100 μm, 120 μm, 140 μm, 160 μm, 180 μm, 200 μm, 220 μm, 240 μm or 250 μm.

Preferably, the glass composition of the core region 110 is characterized as a fused silica, soda-lime silicate glass, alkali borosilicate glass or an aluminosilicate glass. The soda-lime silicate glass can comprise varying levels of $Na_2O$, $CaO$ and $SiO_2$. For example, a suitable soda-lime silicate glass composition is: $72SiO_2$-$17Na_2O$-$4CaO$-$5LiO_2$-$2MgO$ given in weight percent. The alkali borosilicate glass can comprise varying levels of $SiO_2$, $B_2O_3$ and an alkali, e.g., $Na_2O$. For example, a suitable alkali borosilicate glass composition is: $75SiO_2$-$10B_2O_3$-$25Na_2O$ given in weight percent. The aluminosilicate glass can comprise varying levels of $SiO_2$ and $Al_2O_3$. An alkali, e.g., $Na_2O$, may also be included in the aluminosilicate glass composition. For example, suitable aluminosilicate glass compositions include: $50.0$-$75.0SiO_2$-$0.0$-$20.0B_2O_3$-$0.0$-$15.0Al_2O_3$-$0.0$-$1.5Li_2O$-$3.0$-$11.0Na_2O$ given in weight percent.

As noted earlier, the core region 110 of light-diffusing fiber 100 can be a doped, low-melting point silica glass. In other aspects, the core region 100 is primarily composed of un-doped fused silica. For fibers 100 with doped core regions 110, the doping levels in the core region 110 should be sufficient to increase the refractive index of the core region 110 such that the numerical aperture, NA, of the light-diffusing optical fiber 100 is greater than or equal to 0.4. Preferably, the dopants used to dope the core region 110 are up-dopants that can raise the refractive index, $n_1$, of the core region 110. Suitable dopants for the core region 110 include: $TiO_2$, $P_2O_5$, $GeO_2$, $ZnO$, $MgO$, La, Er, Tm, Pb, Ti, Al and Nd. Combinations of these dopants are also feasible in the core region 110. For example, the core region 110 can be doped with up to 10 mol % $TiO_2$, up to 15 mol % $Al_2O_3$, up to 20 mol % $GeO_2$ and/or up to 25 mol % $P_2O_5$. It is also preferable to introduce the dopant(s) into the core region 110 in a gaseous or melt form during the processes employed to fabricate light-diffusing optical fiber 100. This ensures that the dopants are homogenously distributed within the core region 110 at an elemental or molecular scale.

Still referring to FIGS. 1A and 1B, the light-diffusing optical fiber 100 comprises an inner cladding 120 that surrounds the core region 110. For fibers 100 relying on core regions 110 having an un-doped fused silica composition, the inner cladding 120 can comprise a polymeric material. The use of a polymeric material in the inner cladding 120 of such fibers can served to increase the numerical aperture of the fiber 100 to 0.4 or greater.

In contrast, for fibers 100 relying on a doped, glass composition in the core region 110, the inner cladding 120 can comprises a glass composition that substantially differs from the glass composition of the core region 110. The inner cladding 120 possesses a refractive index, $n_2$, and an outer radius $R_2$. Preferably, the composition of inner cladding 120 is selected such that $n_2 < n_1$ (see FIG. 1B). It is also a preference to select the composition of inner cladding 120 in view of the composition of core region 110 to ensure that NA is greater than or equal to 0.4. It is also preferable to employ an un-doped glass composition for inner cladding 120 of the light-diffusing optical fiber 100. In some embodiments, inner cladding 120 can comprise a silica glass that is down-doped with a down-dopant, e.g., fluorine. In other embodiments, the inner cladding 120 is comprised of a glass with a relative refractive index ($\Delta_2$) that is negative when $n_{REF}$ is given by the refractive index of pure silica glass. For example, the relative refractive index of the inner cladding 120, $\Delta_2$, may be less than about −0.5% and in some embodiments less than −1%.

In general, the inner cladding 120 of light-diffusing optical fiber 100 generally extends from the outer radius, $R_1$, of the core region 110 to an outer radius, $R_2$ (see FIG. 1A). In some embodiments, the thickness of the inner cladding 120 (i.e., thickness=$R_2$−$R_1$) is greater than about 10 μm, greater than about 20 μm, greater than about 50 μm or greater than about 70 μm. In some embodiments, the inner cladding 20 has a thickness of about 10 μm, 20 μm, 30 μm, 40 μm, 50 μm, 60 μm, 70 μm, 80 μm, 90 μm, or 100 μm.

Referring to FIGS. 1A and 1B, the light-diffusing optical fiber 100 can further comprise an outer cladding 130 that surrounds the inner cladding 120. The outer cladding 130 has a refractive index $n_3$ a relative refractive index $\Delta_3$, and can comprise a clear layer of secondary coating material, e.g., a fluorinated or a non-fluorinated polymer composition, typical of telecommunications optical fibers for mechanical handling purposes. Typically, the refractive index of the outer cladding 130 can be lower or higher than the refractive indices of the inner cladding 120 and the core region 110 (see FIG. 1B). As shown in FIG. 1A, outer cladding 130 has a radius, $R_3$, as defined from the fiber axis 102.

As depicted in FIGS. 1A and 1B, the outer cladding 130 can comprise an inner layer 134 and an outer scattering layer 136, with the outer scattering layer 136 surrounding the inner layer 134. The outer scattering layer 136 of outer cladding 130 can be doped with light scattering agents 132, such as $TiO_2$ particles and/or other scattering particles. In other embodiments (not shown), the outer cladding 130 can comprise an outer scattering layer 136 with no inner layer 134. In some of these embodiments, outer scattering layer 136 can be doped with light scattering agents 132, such as $TiO_2$ particles. Outer scattering layer 136 can be prepared according to the configurations and methods found in, for example, U.S. application Ser. No. 13/713,224, published as U.S. Patent Application Publication No. 2013/0156391 on Jun. 20, 2013, herein incorporated by reference.

Referring again to FIGS. 1A and 1B, the outer cladding 130 surrounds and is generally in contact with the inner cladding 120. Preferably, the outer cladding 130, and its sublayers—inner layer 134 and outer scattering layer 136, comprise a polymeric coating. The polymeric coating may comprise any liquid polymer or prepolymer material into which the scattering agents 132 could be added and in which the blend may be applied to the light-diffusing optical fiber 100 as a liquid and then converted to a solid after application to the fiber 100. In some embodiments, the outer cladding 130 comprises a polymer coating such as an acrylate-based polymer, e.g., CPC6, manufactured by DSM Desotech, Elgin, Ill., or a silicone-based polymer further comprising a plurality of scattering agents 132. In another embodiment, the outer cladding 130 comprises a low refractive index polymeric material such as UV- or thermally-curable fluoroacrylate, such as PC452 available from SSCP Co. Ltd. 403-2, Moknae, Ansan, Kyunggi, Korea. In some embodiments, it was most efficient to blend the scattering agents 132 into standard UV-curable acrylate-based optical fiber coatings, such as Corning Inc.'s standard CPC6 secondary optical fiber coating. To make the blends of scattering agents 132, a concentrate was first made by mixing 30% by weight of the scattering agent into DSM 950-111 secondary CPC6 optical fiber coating and then passing the mix over a three-roll mill. These concentrates were then either applied directly as coatings or were further diluted with DSM 950-111 to give the desired scattering effect in light-diffusing optical fiber 100.

In some other embodiments, the outer cladding 130 can be utilized to enhance the uniformity of the angular distribution and/or the nature of the light that is emitted radially from the core region 110 and out of the light-diffusing optical fiber 100 through the inner cladding 120. The scattering agents 132 incorporated into the outer cladding 130, and particularly outer scattering layer 136, may comprise nano- or micro-particles with an average diameter of from about 200 nm to about 10 μm. In some embodiments, the average diameter of the particles employed as scattering agents 132 is about 200 nm, 300 nm, 400 nm, 500 nm, 600 nm, 700 nm, 800 nm, 900 nm, 1 μm, 2 μm, 3 μm, 4 μm, 5 μm, 6 μm, 7 μm, 8 μm, 9 μm, or 10 μm. The concentration of the scattering agents 132 may vary along the length of the light-diffusing optical fiber 100 or may be constant. Further, the concentration of the scattering agent 132 may be of a weight percent sufficient to provide even scattering of the light out of the fiber 100 while limiting overall attenuation. In some embodiments, the weight percentage of the scattering agents 132 in the outer cladding 130 comprises about 1%, 2%, 3%, 4%, 5%, 6%, 7%, 8%, 9%, 10%, 11%, 12%, 13%, 14%, 15%, 16%, 17%, 18%, 19%, 20%, 25%, 30%, 35%, 40%, 45%, or 50%. In some embodiments, the outer cladding 130 possesses small particles as scattering agents 132, which comprise metal oxides or other high refractive index material, such as $TiO_2$, ZnO, $SiO_2$, or Zr. The scattering material employed as scattering agents 132 may also comprise micro- or nano-sized particles or voids of low refractive index, such as gas bubbles.

In outer cladding 130, the outer scattering layer 136 generally extends from the outer radius of the inner layer 134 when inner layer 134 is present. Otherwise, outer scattering layer 136 generally extends from the outer radius, $R_2$, of the inner cladding 120 to its radius, $R_3$ (see FIG. 1B). In some embodiments described herein, the thickness of the outer scattering layer 136 is greater than about 1 μm, 2 μm, 3 μm, 4 μm, 5 μm, 6 μm, 7 μm, 8 μm, 9 μm, 10 μm, 20 μm, 30 μm, 40 μm, 50 μm, 60 μm, 70 μm, 80 μm, 90 μm, or 100 μm.

In some embodiments, the scattering agents 132 may contain scattering particles including, but not limited to, TiO$_2$-based particles, such as white ink, which provides for an angle independent distribution of light scattered from the core region 110 and inner cladding 120 of the light-diffusing optical fiber 100. In some embodiments, the scattering agents 132 are located within outer scattering layer 136 within outer cladding 130. For example, in some embodiments, outer scattering layer 136 may have a thickness of about 1 µm to about 5 µm. In other embodiments, the thickness of outer scattering layer 136 and/or the concentration of the scattering agents 132 in the outer scattering layer 136 may be varied along the axial length of the light-diffusing optical fiber 100 so as to provide more uniform variation in the intensity of light scattered from the fiber 100 at large angles (i.e., angles greater than about 15 degrees).

Referring to FIGS. 1 and 1A, light-diffusing optical fiber 100 efficiently scatters laser light output 24 directed into one of its ends out through the core region 110, inner cladding 120 and outer cladding 130 as scattering light rays in the form of diffuse light pattern 60. In general, the relatively high levels of dopants in the core region 110 of certain embodiments of the optical fiber 100 provide a scattering contribution that is associated with the localized compositional fluctuations from the dopants. Further, differences in viscosity between the glass compositions employed in the inner cladding 120 and the core region 110 lead to structural imperfections at the interface between the core region 110 and the inner cladding 120. These imperfections promote a small angle scattering ("SAS") contribution to the overall ability of the fiber 100 to scatter light along its length. In addition, the relatively high refractive index of the core region 110 also promotes scattering through Rayleigh scattering effects. Collectively, these light scattering contributions associated with light-diffusing optical fiber 100 are governed by Equation (1):

$$B = B_R + B_C + B_{SAS} \quad (1)$$

where B is the overall scattering loss associated with light-diffusing optical fiber 100, $B_R$ is the Rayleigh scattering contribution, $B_C$ is the scattering contribution associated with compositional fluctuations from a doped core region 110 (in certain embodiments of fiber 100), and $B_{SAS}$ is the small angle scattering contribution associated with viscosity differences between the glass compositions employed in the core region 110 and the inner cladding 120.

Rayleigh scattering in the core region 110 of the light-diffusing optical fiber 100 depends on both the fictive temperature of the glass and its composition. In particular, Equation (2) below provides the Rayleigh scattering contribution, $B_R$, associated with the core region 110 of the fiber 100:

$$B_R = 5 \times 10^{-5} n^8 p^2 T_g K_T \quad (2)$$

where n is the refractive index, p is the stress-optical coefficient, $K_T$ is the isothermal compressivity, and $T_g$ is the glass transition temperature for the glass composition selected for the core region 110. As discussed earlier, the glass composition of the core region 110 is selected such that it possesses a relatively high refractive index, $n_1$, particularly in comparison to the refractive index of the inner cladding 120, $n_2$. The dopant levels in certain aspects of the core region 110 also contribute to the relatively high refractive index $n_1$. The relatively high refractive index $n_1$ in the core region 110 contributes to high Rayleigh scattering loss effects, as demonstrated by Equation (2).

In addition, the dopant levels in the core region 110 for certain aspects of fiber 100 also provide a compositional-based scattering effect, $B_C$ as given by Equation (3) below:

$$B_c = 2.4 V n^2 (dn/dc)^2 c (1-c) \quad (3)$$

where V is the molar fraction of the dopants in the core region 110, n is the refractive index in the core region 110, dn/dc is the refractive index change associated with a particular dopant in the core region 110 and c is the concentration of the dopant in the core region 110. For multiple dopants, e.g., TiO$_2$ and ZnO, the contributions associated with each dopant may be separately calculated and added to provide the $B_c$ scattering contribution. The effective scattering contribution associated with each dopant is particularly sensitive to its dn/dc value. As discussed earlier, effective dopants include oxides of Ge, P, Na, Pb, La, Zn, Al and others. Most of these dopants have very little impact on the absorption of incident light (e.g., in the form of laser light output 24) in the wavelength range of 400-1700 nm within each light-diffusing optical fiber 100. Nevertheless, the processes used to introduce these dopants and the relatively high levels of these dopants in the core region 110 of fiber 100 (particularly as compared to core dopant levels in telecommunications optical fibers) can degrade the optical transmission of the fiber 100 due to absorption in the wavelength of interest. But at the relatively short application lengths associated with the intended applications for light-diffusing optical fiber 100, these absorption levels (~1 dB/m) are tolerated.

It is preferable to employ light-diffusing optical fibers 100 in the general length range of about 0.1 m to about 100 m, particularly in view of limited absorption losses associated with the dopants employed in the core region 110 at these lengths for certain aspects of the fiber 100. In some embodiments described herein, the light-diffusing optical fiber 100 will generally have a length from about 100 m, 75 m, 50 m, 40 m, 30 m, 20 m, 10 m, 9 m, 8 m, 7 m, 6 m, 5 m, 4 m, 3 m, 2 m, 1 m, 0.75 m, 0.5 m, 0.25 m, 0.15 m, or 0.1 m.

The SAS contribution, $B_{SAS}$, is associated with viscosity differences between the glass compositions employed in the core region 110 and the inner cladding 120. In particular, the $B_{SAS}$ contribution originates from draw instabilities between the core region 110 and the inner cladding 120 during formation of the light-diffusing optical fiber 100 using a down-draw process. These instabilities lead to defects and other micro-deformations at the interface between the core region 110 and the inner cladding 120, providing a small angle scattering effect. The magnitude of $B_{SAS}$ can be as large as ~10-100% of the Rayleigh scattering contribution, $B_R$.

Advantageously, the light-diffusing optical fibers 100 described herein have a scattering-induced attenuation loss in the range of about 0.5 to about 5 dB/m (at wavelengths from 400 to 1700 nm). Such light-diffusing optical fibers 100 possess light scattering contributions as given by Equation (1), described earlier. For certain applications, it is preferable to tailor fibers 100 to possess a scattering-induced attenuation loss in the range of about 1 to about 2 dB/m. In other applications, it is preferable to tailor the attenuation loss of fibers 100 in the range of about 2 to about 5 dB/m.

As described herein, the light-diffusing optical fibers 100 can be constructed to produce uniform illumination along their entire length. In other embodiments, light-diffusing optical fibers 100 can be constructed to produce uniform illumination along a segment of the fiber which is less than the entire length of the fiber. The phrase "uniform illumination," as used herein, means that the intensity of light emitted from the light-diffusing fiber, e.g., optical fibers 100, does not vary by more than 25% over the specified length.

The light-diffusing optical fibers 100 described herein may be formed using various processing techniques. Generally, the fibers 100 are drawn from an optical fiber preform with a fiber take-up systems and exit the draw furnace along a substantially vertical pathway. In view of the $B_{SAS}$ contributions, it is preferable to select the glass compositions of the core region 110 and the inner cladding 120 such that they possess a mismatch in viscosities at a given draw temperature. In some embodiments, the glass compositions of the core region 110 and the inner cladding 120 of the light-diffusing optical fibers 100 are selected such that they possess an absolute viscosity mismatch, $\Delta\eta$, in the range of about 1 to about 10 poise at the draw temperature selected for fiber processing. That is, $\Delta\eta=|\eta_{core}-\eta_{clad}|=\sim 1$ to 10 poise, where $\eta_{core}$ and $\eta_{clad}$ are the viscosities of the glass compositions of the core region 110 and the inner cladding 120, respectively, at a given draw temperature.

After the light-diffusing optical fibers 100 exit the draw furnace, the fibers 100 can be coated such that one or more polymeric layers are applied to form the outer cladding 130. In some embodiments, scattering agents 132 can be employed in the outer scattering layer 136 of the outer cladding 130.

It will be apparent to those skilled in the art that various modifications and variations can be made without departing from the spirit or scope of the claims.

What is claimed is:

1. A light illumination system, comprising:
   a light-diffusing optical fiber capable of multimode operation in a wavelength range from 300 to 3000 nm; and
   a laser light source comprising a control element and a laser diode having a cavity, the source configured to produce a laser light output in response to an injection current input,
   wherein the laser light source is arranged in proximity to the light-diffusing optical fiber such that that the laser light output is coupled into the light-diffusing optical fiber and such that the light-diffusing optical fiber produces a diffuse light pattern emanating from at least a portion of a length of the light-diffusing optical fiber in response to the laser light output, and
   further wherein the control element is arranged to reduce speckle in the diffuse light pattern emanating from the light-diffusing optical fiber by modulating the injection current input at a modulation frequency of 30 Hz or greater.

2. The illumination system according to claim 1, wherein the laser light output is coupled into the light-diffusing optical fiber through a transmission optical fiber.

3. The illumination system according to claim 1, wherein the control element is configured to reduce speckle in the diffuse light pattern emanating from the light-diffusing optical fiber by modulating the injection current input at a modulation frequency of 60 Hz or greater.

4. The illumination system according to claim 1, wherein the control element is configured to reduce speckle in the diffuse light pattern emanating from the light-diffusing optical fiber by modulating the injection current input with a waveform selected from the group consisting of a square, sawtooth, triangular and sinusoidal waveforms.

5. The illumination system according to claim 1, wherein the control element is configured to reduce speckle in the diffuse light pattern emanating from the light-diffusing optical fiber by modulating the injection current input with a sinusoidal waveform.

6. The illumination system according to claim 1, wherein the light-diffusing optical fiber has a numerical aperture greater than or equal to 0.4.

7. The illumination system according to claim 1, wherein the light-diffusing optical fiber comprises a core region having a radius from about 50 μm to about 600 μm.

8. The illumination system according to claim 1, wherein the diffuse light pattern produced by the light-diffusing optical fiber is characterized by attenuation from 0.5 dB/m to 5 dB/m.

9. The light illumination system according to claim 1, wherein the light-diffusing optical fiber comprises:
   (a) a core region that comprises a core glass composition,
   (b) an inner cladding that surrounds the core region and comprises a cladding glass composition that substantially differs from the core glass composition, and
   (c) an outer cladding that surrounds the inner cladding and is doped with scattering particles.

10. The illumination system according to claim 9, wherein the light-diffusing optical fiber has a numerical aperture greater than or equal to 0.4.

11. The illumination system according to claim 9, wherein the light-diffusing optical fiber comprises a core region having a radius from about 50 μm to about 600 μm.

12. The illumination system according to claim 9, wherein the diffuse light pattern produced by the light-diffusing optical fiber is characterized by attenuation of 0.5 dB/m to 5 dB/m.

13. The illumination system according to claim 9, wherein the core region of the light-diffusing optical fiber has a low-melting point glass composition comprising an up-dopant.

14. A method of reducing speckle from a laser-illuminated light diffusing optical fiber, comprising the steps:
   directing laser light output from a laser light source comprising a laser diode into a light-diffusing optical fiber capable of multimode operation in a wavelength range from 300 to 3000 nm, wherein the laser light output is based at least in part on an injection current in the laser diode;
   producing a diffuse light pattern that emanates from the cladding of the light-diffusing optical fiber based on the laser light output directed into the fiber;
   controlling a magnitude and a temporal aspect of the injection current with a control element; and
   modulating the injection current with the control element at a modulation frequency of 30 Hz or greater to minimize speckle in the diffuse light pattern emanating from the fiber.

15. The method according to claim 14, wherein the light-diffusing optical fiber has a numerical aperture of greater than or equal to 0.4.

16. The method according to claim 14, wherein the light-diffusing optical fiber comprises a core region having a radius from about 50 μm to about 600 μm.

17. The method according to claim 14, wherein the diffuse light pattern produced by the light-diffusing optical fiber is characterized by attenuation from 0.5 dB/m to 5 dB/m.

18. The method according to claim 14, wherein the light-diffusing optical fiber comprises:
   (a) a core region that comprises a core glass composition,
   (b) an inner cladding that surrounds the core region and comprises a cladding glass composition that substantially differs from the core glass composition, and
   (c) an outer cladding that surrounds the inner cladding and is doped with scattering particles.

19. The method according to claim 14, wherein the modulating of the injection current is effected with a waveform selected from the group consisting of a square, sawtooth, triangular and sinusoidal waveforms.

* * * * *

UNITED STATES PATENT AND TRADEMARK OFFICE
CERTIFICATE OF CORRECTION

PATENT NO. : 10,222,629 B2
APPLICATION NO. : 15/002764
DATED : March 5, 2019
INVENTOR(S) : Anthony Sebastian Bauco It is certified that error appears in the above-identified patent and that said Letters Patent is hereby corrected as shown below:

On the Title Page

Column 2, item (56), Foreign Patent Documents, above "Other Publications" delete "DE 102008009138 A1 8/2009, JP 2010042153 A 2/2010, WO 2015008211 A1 2/2015".

Column 2, item (56), Other Publications, below "other publications" delete "Dingel et al. "Laser-diode microscope with fiber illumination", Optics Communications, vol. 93 No. 1-2 (1992) pp. 27-32 XP024455507.".

On page 2, Column 1, item (56), U.S. Patent Documents, below "8644651 2/2014 Dougherty" delete "2011/0319712 12/2011 Kuroda et al.".

On page 2, Column 1, item (56), U.S. Patent Documents, below "2013/0136406 5/2013 Bookbinder" delete "2013/0156391 6/2013 Logunov et al., 2013/0272014 10/2013 Logunov et al., 2014/0355295 12/2014 Kuchinisky".

On page 2, Column 1, item (56), U.S. Patent Documents, below "2015/0346411 12/2015 Bauco" delete "2016/0146998 5/2016 Tissot".

On page 2, Column 1, item (56), Other Publications, below "other publications" delete "International Search Report and Written Opinion PCT/US2016/016483 dated Aug. 10, 2016.".

In the Claims

In Column 13, Line 38, Claim 1, delete "that that" and insert -- that --, therefor.

Signed and Sealed this
Twenty-first Day of January, 2020

Andrei Iancu
*Director of the United States Patent and Trademark Office*